(12) United States Patent
Xue et al.

(10) Patent No.: US 9,595,607 B2
(45) Date of Patent: Mar. 14, 2017

(54) FACILITATION OF INCREASED LOCKING RANGE TRANSISTORS

(71) Applicant: City University of Hong Kong, Kowloon (HK)

(72) Inventors: Quan Xue, New Territories (HK); Haifeng Zhou, Shen Zhen (CN); Kam Man Shum, New Territories (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 0 days.

(21) Appl. No.: 14/809,812

(22) Filed: Jul. 27, 2015

(65) Prior Publication Data

US 2017/0033211 A1  Feb. 2, 2017

(51) Int. Cl.

| | |
|---|---|
| H01L 29/78 | (2006.01) |
| H01L 23/64 | (2006.01) |
| H01L 29/66 | (2006.01) |
| H01L 49/02 | (2006.01) |
| H01L 21/768 | (2006.01) |
| H01L 27/06 | (2006.01) |
| H01L 21/8238 | (2006.01) |
| H01L 29/06 | (2006.01) |
| H03B 19/14 | (2006.01) |

(52) U.S. Cl.
CPC ............. *H01L 29/78* (2013.01); *H01L 21/768* (2013.01); *H01L 21/823871* (2013.01); *H01L 23/645* (2013.01); *H01L 27/0617* (2013.01); *H01L 28/10* (2013.01); *H01L 29/0696* (2013.01); *H01L 29/66477* (2013.01); *H03B 19/14* (2013.01)

(58) Field of Classification Search
CPC ... H01L 29/78; H01L 21/8238; H01L 21/768; H01L 29/66477; H03K 3/36
See application file for complete search history.

(56) References Cited

U.S. PATENT DOCUMENTS

| | | | | |
|---|---|---|---|---|
| 4,197,470 A | * | 4/1980 | Banzhaf | H03K 3/288 257/575 |
| 8,035,112 B1 | * | 10/2011 | Cooper | H01L 23/544 257/76 |
| 2006/0097800 A1 | * | 5/2006 | Guebels | H03B 5/36 331/46 |
| 2014/0266480 A1 | * | 9/2014 | Li | H03B 5/1228 331/117 FE |

(Continued)

OTHER PUBLICATIONS

Zhou, et al., "A Study of the Lock Range of Injection-locked CMOS Active-Inductor Oscillators Using a Linear Control System Approach", IEEE Trans. Circuits and Systems—II: Express Briefs, Oct. 2011, pp. 627-631, vol. 58, No. 10, IEEE, 5 Pages.

(Continued)

*Primary Examiner* — Phuc Dang
(74) *Attorney, Agent, or Firm* — Amin, Turocy & Watson, LLP

(57) ABSTRACT

Transistors can be used for a variety of electronic-based applications. Therefore, transistor efficiency and performance is of importance. An apparatus is presented herein to increase the locking range of transistors by leveraging cross-coupled injection transistors in conjunction with symmetry injection transistors. The transistor efficiency can also be increase by reducing a parasitic capacitance associated with the components of the transistor.

20 Claims, 10 Drawing Sheets

(56) References Cited

U.S. PATENT DOCUMENTS

2015/0061730 A1* 3/2015 Tsai ................ H03K 3/356034
327/57

OTHER PUBLICATIONS

Musa, et al., "A Low Phase Noise Quadrature Injection Locked Frequency Synthesizer for MW—Wave Applications", IEEE Journal of Solid-State Circuits, Nov. 2011, pp. 2635-2649, vol. 46, No. 11, IEEE, 15 Pages.

Kuo, et al., "Design and Analysis of a 77.3% Locking-Range Divide-by-4 Frequency Divider", IEEE Transactions on Microwave Theory and Techniques, Oct. 2011, pp. 2477-2485, vol. 59, No. 10, IEEE, 9 Pages.

Feng, et al., "V-band injection-locked oscillator with 9 GHz locking range", Electronic Letters, Apr. 2013, vol. 49, No. 8., 2 Pages.

* cited by examiner

FACILITATION OF INCREASED LOCKING RANGE TRANSISTORS

TECHNICAL FIELD

This disclosure relates generally to transistors. More specifically, this disclosure relates to increasing transistor performance.

BACKGROUND

A transistor is a semiconductor device used to amplify and switch electronic signals and electrical power. It is composed of semiconductor material with at least three terminals for connection to an external circuit. A voltage or current applied to one pair of the transistor's terminals changes the current through another pair of terminals. Because the controlled (output) power can be higher than the controlling (input) power, a transistor can amplify a signal. Some transistors are packaged individually, but many are found embedded in integrated circuits.

Transistors are utilized for their ability to use a small signal applied between one pair of its terminals to control a much larger signal at another pair of terminals. This property is called gain. It can produce a stronger output signal, a voltage, or current, that is proportional to a weaker input signal; that is, it can act as an amplifier. Alternatively, the transistor can be used to turn current on or off in a circuit as an electrically controlled switch, where the amount of current is determined by other circuit elements.

There are two types of transistors, which have slight differences in how they are used in a circuit. A bipolar transistor has terminals labeled base, collector, and emitter. A small current at the base terminal (that is, flowing between the base and the emitter) can control or switch a much larger current between the collector and emitter terminals. For a field-effect transistor, the terminals are labeled gate, source, and drain, and a voltage at the gate can control a current between source and drain.

The above-described background relating to transistors is merely intended to provide a contextual overview of transistors, and is not intended to be exhaustive. Other context regarding transistors may become further apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the purpose of this summary is to present some concepts related to some exemplary non-limiting embodiments in simplified form as a prelude to more detailed description of the various embodiments that follow in the disclosure.

The objective of the disclosure is to develop a means for increasing a locking range of a transistor. The locking range of the transistor can be the frequency range of a frequency divider in a phase-locked loop (PLL) for which it is able to stay locked, and can be defined by a voltage controlled oscillator (VCO) range. A phase-lock loop can be a control system that generates an output signal whose phase is related to the phase of an input signal. The oscillator can generate a periodic signal. The phase detector can compare the phase of that signal with the phase of the input periodic signal and adjust the oscillator to keep the phases matched. Bringing the output signal back toward the input signal for comparison can be defined as a feedback loop since the output can be 'fed back' toward the input forming a loop.

Keeping the input and output phase in lock step can also keep the input and output frequencies the same. Consequently, in addition to synchronizing signals, a phase-locked loop can track an input frequency, or it can generate a frequency that is a multiple of the input frequency. These properties can be used for computer clock synchronization, demodulation, and frequency synthesis.

Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase-locked-loop building block, the technique is widely used in modern electronic devices, with output frequencies from a fraction of a hertz up to many gigahertz (GHz).

A parasitic capacitance is an unavoidable and usually unwanted capacitance that exists between the parts of an electronic component or circuit simply because of their proximity to each other. A low-parasitic and common-centroid transistor structure injection-locked frequency divider (ILFD) can allow simple routing, minimize the parasitic capacitances and resistances of interconnects, reduce source and drain-to-body parasitic capacitances, and provide inherent common-centroid characteristic, all of which are conducive to improving a high-frequency and wide locking range performance of complementary metal-oxide-semiconductor (CMOS) ILFDs. The proposed transistor structure can be applied for a 60 GHz ILFD design, which can dissipate 7.5 mA from 0.5 V supply using 65 nm CMOS technology. The proposed ILFD can demonstrate a 16.9 GHz locking range and can operate in 53.8-70.7 GHz without a tuning mechanism.

This disclosure can be applied to the first stage of a frequency divider chain in a high frequency PLL system. Since frequencies around 60 GHz have been opened for unlicensed applications, such PLL systems can be used in the front-end systems of gigabits/point-to-point links, wireless local area networks, high data-rate wireless personal area networks and radars. ILFDs can have low power consumption and high frequency capability in CMOS technologies. However, ILFDs can suffer from narrow locking ranges. Varactors can be used in ILFDs to increase the locking range, but the controlling voltages between the varactors in both the VCO and divider will need to be synchronized, which can significantly increase design complexity with a PLL system design. The current disclosure can use symmetry injection transistors with a source connected to a ground to place all active devices in a standard radio frequency (RF) transistor cell. The symmetry injection structure can increase the injection current and the injection time during every period, which can increase the locking range. All the active devices in an ILFD core can be built on a standard transistor cell, which can reduce the parasitic capacitance of the inductor-capacitor (LC) tank and also increase the operation frequency of ILFD and the locking range.

There are several advantages of the proposed ILFD over existing ILFD where the locking range is the largest one at a 60 GHz frequency band without a tuning mechanism. Therefore, the wide operating frequency range of the ILFD can cover the inevitable shift of the center operating frequency caused by the process variations in the small values of integrated spiral inductance or parasitic capacitance. Lack of a tuning mechanism can simplify the control of PLL between VCO and ILFD.

Described herein are systems, methods, articles of manufacture, and other embodiments or implementations that can facilitate the increase of transistor performance and can be implemented in connection with any type of radio, telecommunications, computers and other electronic applications device.

According to one embodiment, described herein is an apparatus for facilitating increased transistor performance by increasing a locking range and reducing a parasitic capacitance. The apparatus can comprise cross-coupled injection transistors, symmetry injection transistors, and interconnecting nodes, wherein the interconnecting nodes connect sources, drains, and gates of their respective injection transistors.

According to another embodiment, described herein is a method for facilitating a four terminal transistor. The method can comprise facilitating four transistors comprising two cross coupled transistors and two symmetry injection transistors into a standard radio frequency transistor cell. The cross coupled transistors' sources can be tied to a ground, whereas gates of the symmetry injection transistors can be tied to a terminal and the sources of the symmetry injection transistors can be tied to ground too.

According to yet another embodiment, described herein is an apparatus for facilitating increased transistor performance by increasing a locking range and reducing a parasitic capacitance. The apparatus can comprise cross-coupled injection transistors, symmetry injection transistors, and interconnecting nodes, wherein the interconnecting nodes comprise three sources, two drains, and four gates.

These and other embodiments or implementations are described in more detail below with reference to the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
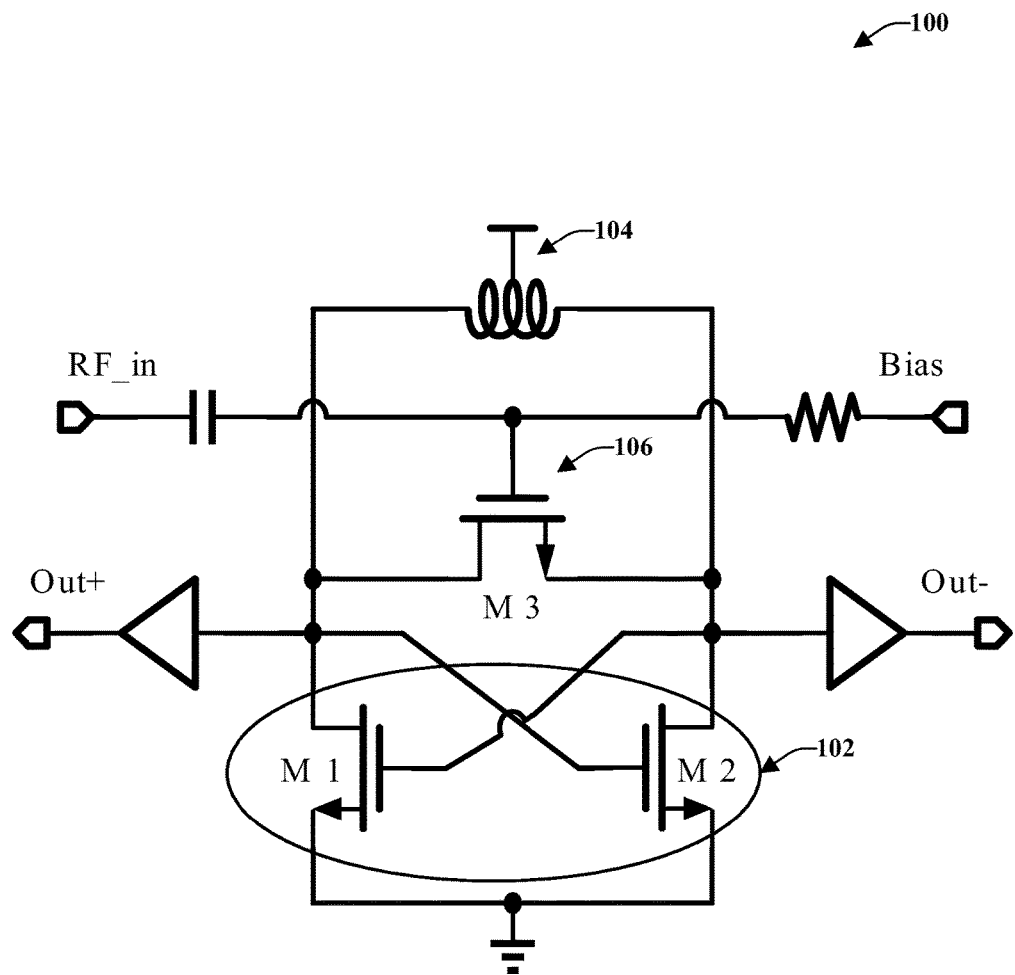
FIG. 1 illustrates an example schematic direct injection metal-oxide semiconductor transistor.

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, these components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, a local area network, a wide area network, etc. with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As an overview of the various embodiments presented herein, to correct for the above-identified deficiencies and other drawbacks of conventional direct injection scheme, various embodiments are described herein to facilitate increase transistor performance.

FIGS. 1-12 illustrate apparatuses and methods that can increase transistor performance by facilitating an increased locking range. For simplicity of explanation, the methods (or algorithms) are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts may be required to implement the methods. In addition, the methods could alternatively be represented as a series of interrelated states via a state diagram or events. Additionally, the methods described hereafter are capable of being stored on an article of manufacture (e.g., a computer readable storage medium) to facilitate transporting and transferring such methodologies to computers. The term article of manufacture, as used herein, is intended to encompass a computer program accessible from any computer-readable device, carrier, or media, including a non-transitory computer readable storage medium.

Referring now to FIG. 1, illustrated is an example schematic direct injection metal-oxide semiconductor (MOS) transistor 100. A conventional direct injection scheme based on a MOS transistor switch over the tank is shown in FIG. 1. The injection-locked oscillator can comprise a cross-coupled n-channel MOS pair 102, a center-taped inductor 104, and a direct injection transistor 106. An LC tank can absorb a parasitic capacitance into a resonator. The direct injection MOS transistor can comprise the parasitic capacitance of the cross-coupled NMOS pair 102, the parasitic capacitance of the direct injection transistor 106, a load capacitance of a next stage, and the parasitic capacitance of an interconnected metal path. For measurement purposes, the locking range, $\Delta\omega$, can be determined by Eqn. 1 below:

$$|\Delta\omega|_{max} \propto \left|\frac{\alpha_2 V_i}{C}\right| \quad \text{(Eqn. 1)}$$

where $V_i$ can be the amplitude of the input signal, $\alpha_2$ can be the second order nonlinear coefficient of the injection transistor, and C can be the capacitance of the resonator. Therefore, the locking range can be improved by reducing the parasitic capacitors.

The direct current (DC) voltage at the source and drain terminals of injection transistor M3 is a voltage generated by a supply voltage (VDD). If the voltage bias (Vbias) at the gate terminal of M3 is also VDD, then the time M3 is "on" is less than half of a period an injection signal. Meanwhile, the parasitic capacitance at the source of M3 can be different than that of the drain. This asymmetry can make it difficult to improve the performance of the ILFD. Therefore, to improve the locking range of the ILFD, the parasitic capacitance of the LC tank should be minimized. The second important dependency of locking range can be on the injection power, the improvement of which can increase the locking range.

Figure 2:
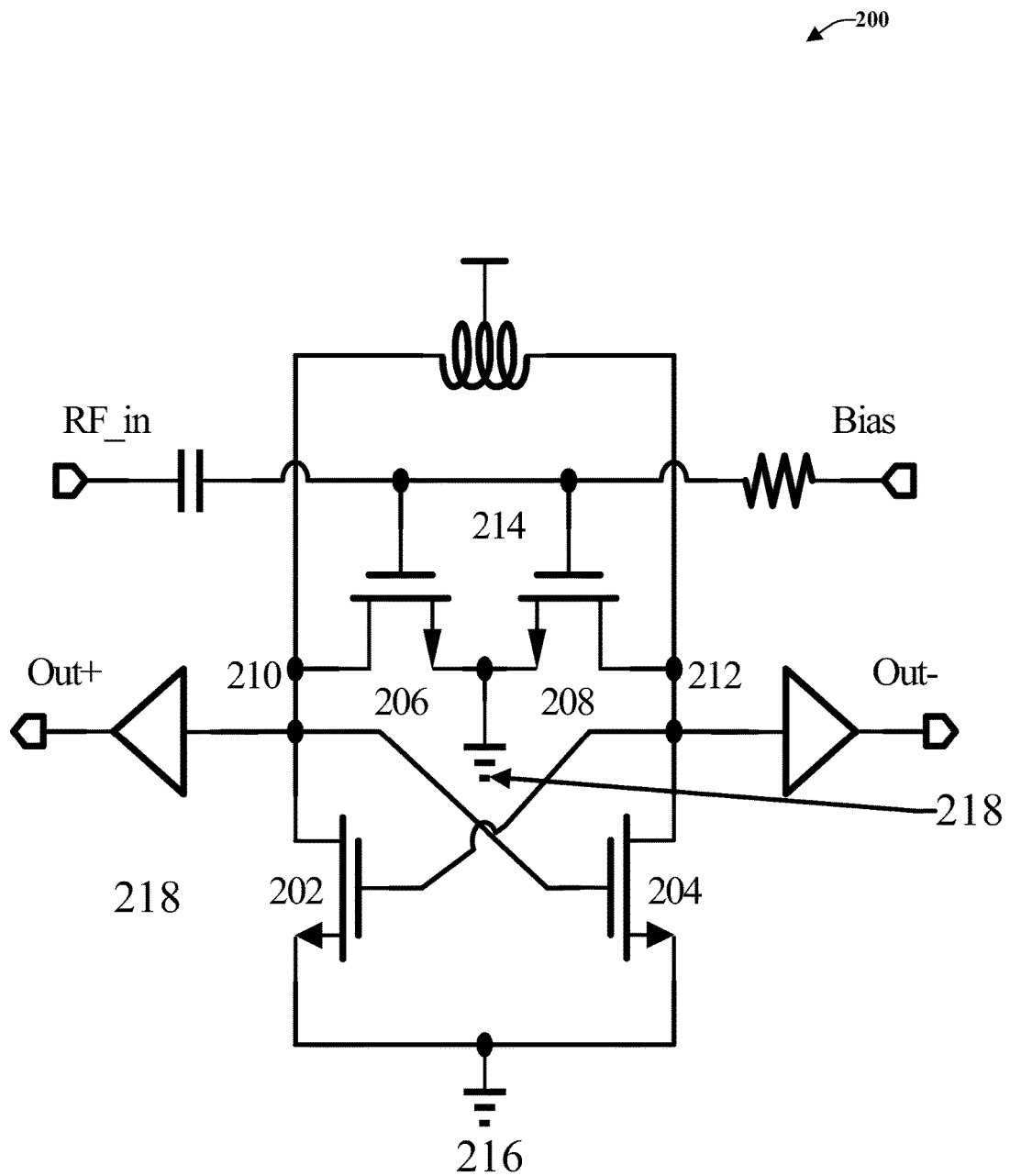
FIG. 2 illustrates an example schematic of a symmetry injection-locked frequency divider apparatus.

Referring now to FIG. 2, illustrated is an example schematic of a symmetry injection-locked frequency divider apparatus. FIG. 2 shows a proposed symmetry ILFD schematic. The symmetry ILFD can employ two injection transistors 206 208 with sources connected to a ground 216, so that the injection transistors 206 208 "on" time is more than half of the period of the injection signal. The injection current can also be bigger than that of the conventional direct injection transistor. However, for the same transconductance amplifier ($g_m$) during injection, the size of the symmetry ILFD structure could be twice size of that of the single transistor in FIG. 1., which can induce additional parasitic capacitance and reduce the locking range.

For conventional RF NMOS transistor structures, each transistor can be placed in a cell with circulating body and a deep N-well. Since the transistors are generally spaced apart from each other, a density of the impurities implanted into the gate area varies from one area to the other. Therefore a threshold voltage difference can occur amongst these transistors, which can also cause asymmetry, and the circuit may not operate as designed.

The symmetry ILFD of FIG. 2 can comprise cross-coupled NMOS transistors 202 204, and symmetry injection transistors 206 208, which share common nodes and the source terminals are connected to a ground 216. The symmetry ILFD also comprises a drain of the cross-coupled NMOS transistor 202, a gate of the cross-coupled NMOS transistor 204, a drain of symmetry injection transistors 206, which are tied to a node 210. Furthermore, the symmetry ILFD can comprise a drain of the cross-coupled NMOS transistor 204, a gate of the cross-coupled NMOS transistor 202, and a drain of the symmetry injection transistor 208, which are tied to a node 212. The gates of the symmetry injection transistors 206 208 are tied to a node 214. Therefore, the transistors can share drain terminals to reduce the parasitic junction capacitance in the following manner.

A first injection transistor 202 can comprise a first source. A second injection transistor 204 can comprise a second source, wherein the first injection transistor 202 and the second injection transistor 204 can be cross coupled, and wherein the first source and the second source can be connected to a first ground 216. The cross-connection of the first injection transistor 202 and the second injection transistor 204 can be the only cross-connection, which can limit parasitic capacitance. A first symmetry injection transistor 206 can comprise a third source, and a second symmetry injection transistor 208 can comprise a fourth source, wherein the third source and the fourth source can be connected to a second ground 218. The first symmetry injection transistor 206 and the second symmetry injector transistor 208 can share a common node and all of the source terminals can be connected to the second ground 218. A first node 210 can comprise a first drain of the first injection transistor 202, a first gate of the second injection transistor 204, and a second drain of the first symmetry injection transistor 206. A second node 212 can comprise a third drain of the second injection transistor 204, a second gate of the first injection transistor 202, and a forth drain of the second symmetry injection transistor 208. A third node 214 can comprise a third gate of the first symmetry injection transistor 206, and a fourth gate of the second symmetry injection transistor 208.

Figure 3:
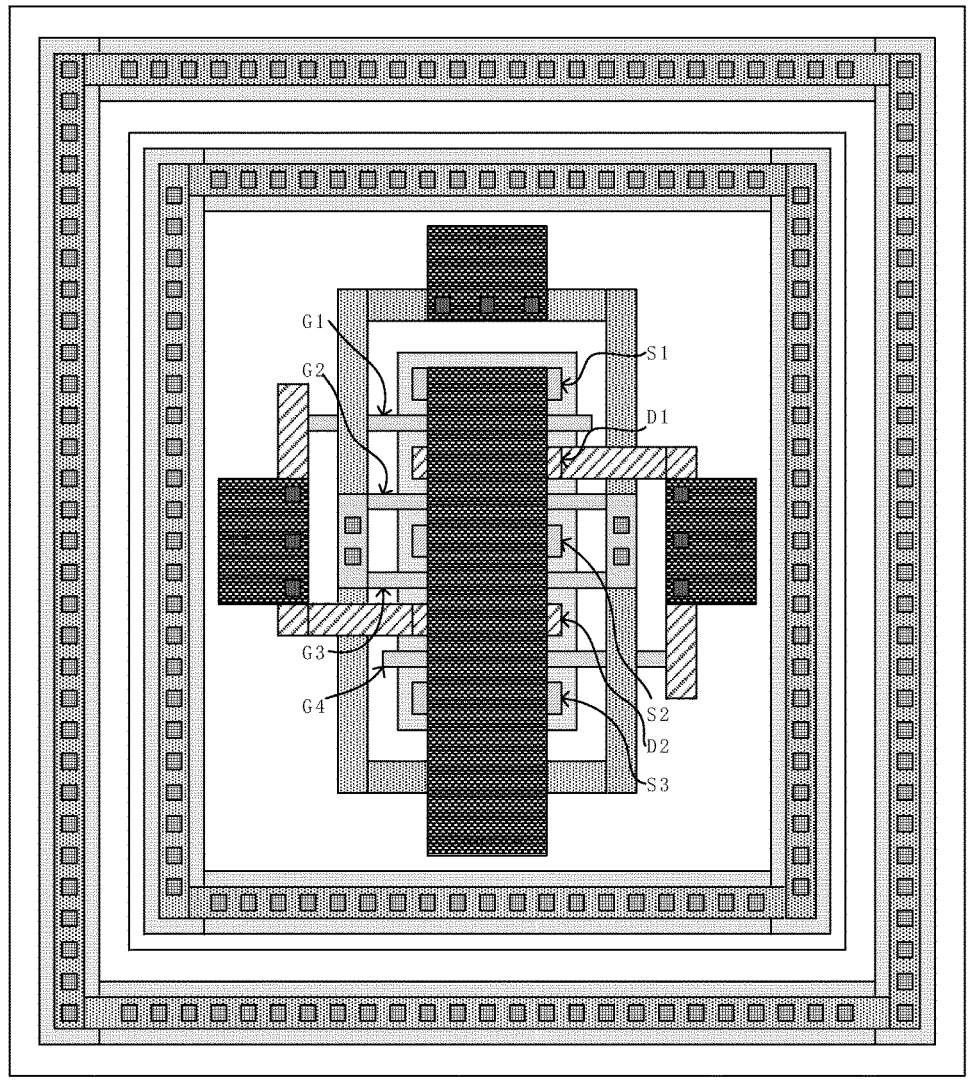
FIG. 3 illustrates an example schematic of a four terminal transistor.

Referring now to FIG. 3, illustrated is an example schematic of a four terminal transistor. FIG. 3 is representative of an example reconfigured 4-terminal transistor, as shown in FIG. 2, when the widths and gate numbers of the transistors 202 204 206 208 are the same. The major layers in a CMOS process can be referenced in the legend of FIG. 3 as follows: NW is N-type well layer, PW is P-type well, OD is thin oxide for device, PO is poly-Si for the gate of transistor, CO is the contact window form transistor 202 to OD or PO, MM1 is the first metal layer, VIA1 is the contact hole between MM2 and MM1, MM2 is the second metal layer, VIA2 is the contact hole between MM3 and MM2, and MM3 is the third metal layer.

The reconfigured transistor can comprise three sources S1, S2 and S3, two drains D1 and D2 and four gates G1, G2, G3, and G4. The drain of transistors 202 206 and the gate of transistor 204 can be directly connected to the node 210 through contact with VIA1 and metal layers and then leave the transistor cell. The drain of transistors 204 208 and the gate of transistor 202 can be directly connected to the node 212 through contact with VIA1 and metal layers and then leave the transistor cell. The gates of the transistors 206 208 can be directly connected to the node 214 through contact with the poly layer and then leave the transistor cell.

If using the traditional method (individual transistor) to perform the same layout, there has four individual sources and drains need to be connected. Leveraging the reconfigured transistor, can use half of the drains of the transistors 206 208 being connected, whereas the traditional method requires four individual sources and drains of the transistors to be connected. In addition, the gate-drain cross connection of the transistors 202 204 involves no additional routing and overlapping of interconnects. Therefore, parasitic capacitance can be minimized from the nodes 219 214 and the nodes 212 214. Thus, the reconfigured transistor the layout of the ILFD can be simplified to reduce parasitic capacitance and improve the locking range of the ILFD.

Figure 4:
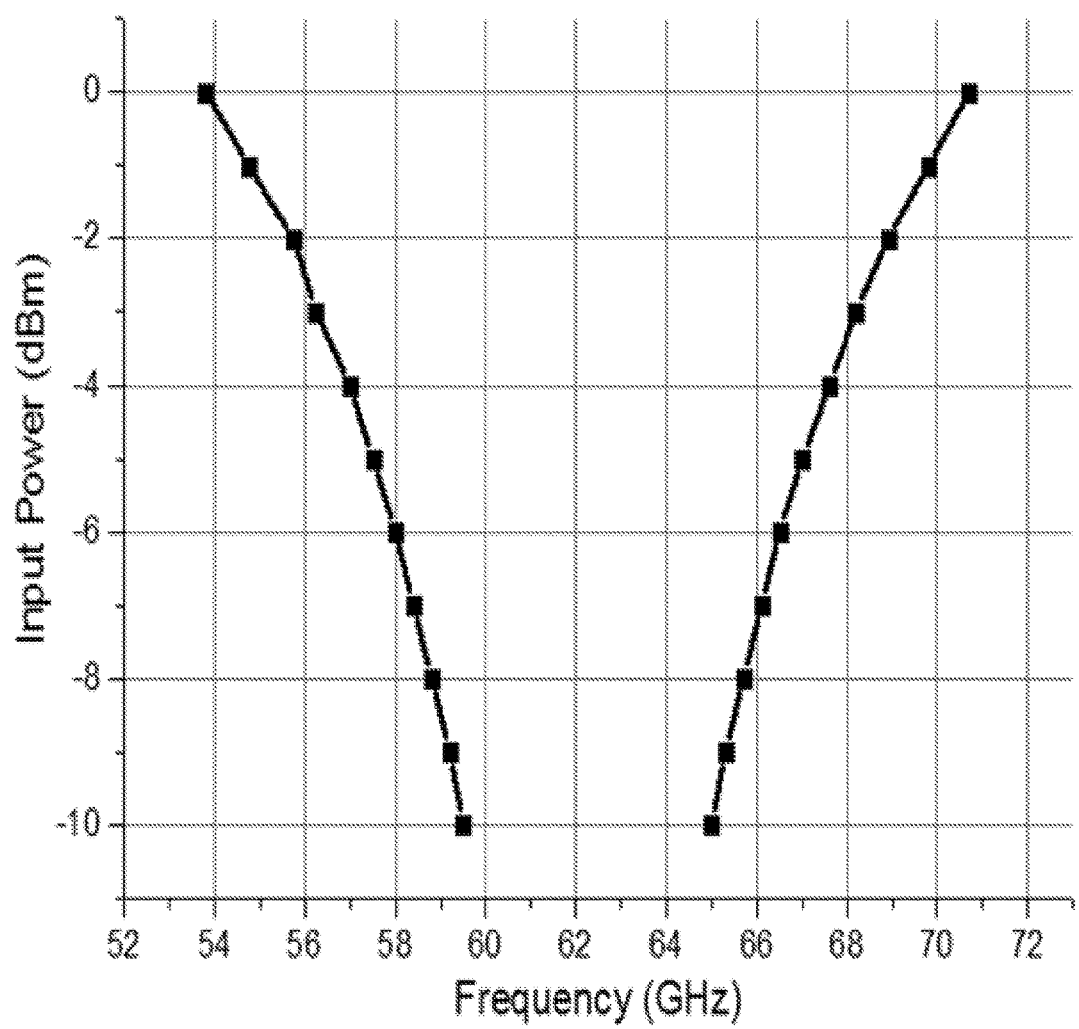
FIG. 4 illustrates an example schematic of an input sensitivity curve for an injection-locked frequency divider apparatus.

Referring now to FIG. 4, illustrated is an example schematic of an input sensitivity curve for an injection-locked frequency divider apparatus. FIG. 4 comprises an input power versus a frequency of a frequency divider circuit, which can result from a circuit simulation. The bias voltage can be set to 0.5 V, which can be equal to the power supply. The ILFD circuit can operate with a maximum input signal frequency at 70.7 GHz, and a minimum input signal frequency at 53.8 GHz. Thus, the ILFD circuit can operate at a center frequency of 62.25 GHz with a frequency locking range of approximately 27.15%.

Figure 5:
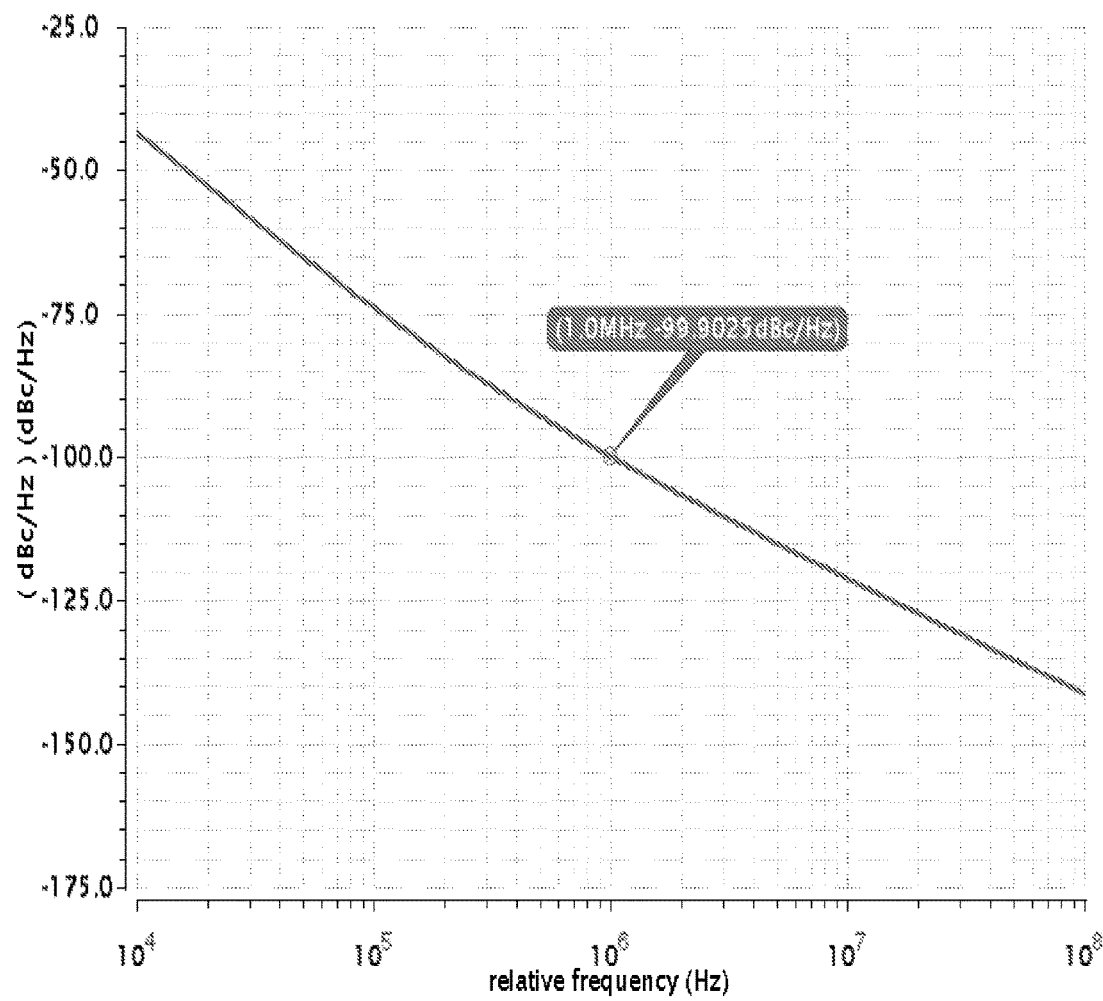
FIG. 5 illustrates an example schematic of a phase noise graph of an injection-locked frequency divider apparatus.

Referring now to FIG. 5, illustrated is an example schematic of a phase noise graph of an injection-locked frequency divider apparatus. FIG. 5 illustrates a graph plot of a phase noise versus an offset frequency of the ILFD under a condition that the input signal can be in an idle state and receive no input signal. As shown, when the offset frequency is 1 MHz, the phase noise can be approximately −99.9 dBc/Hz.

Figure 6:
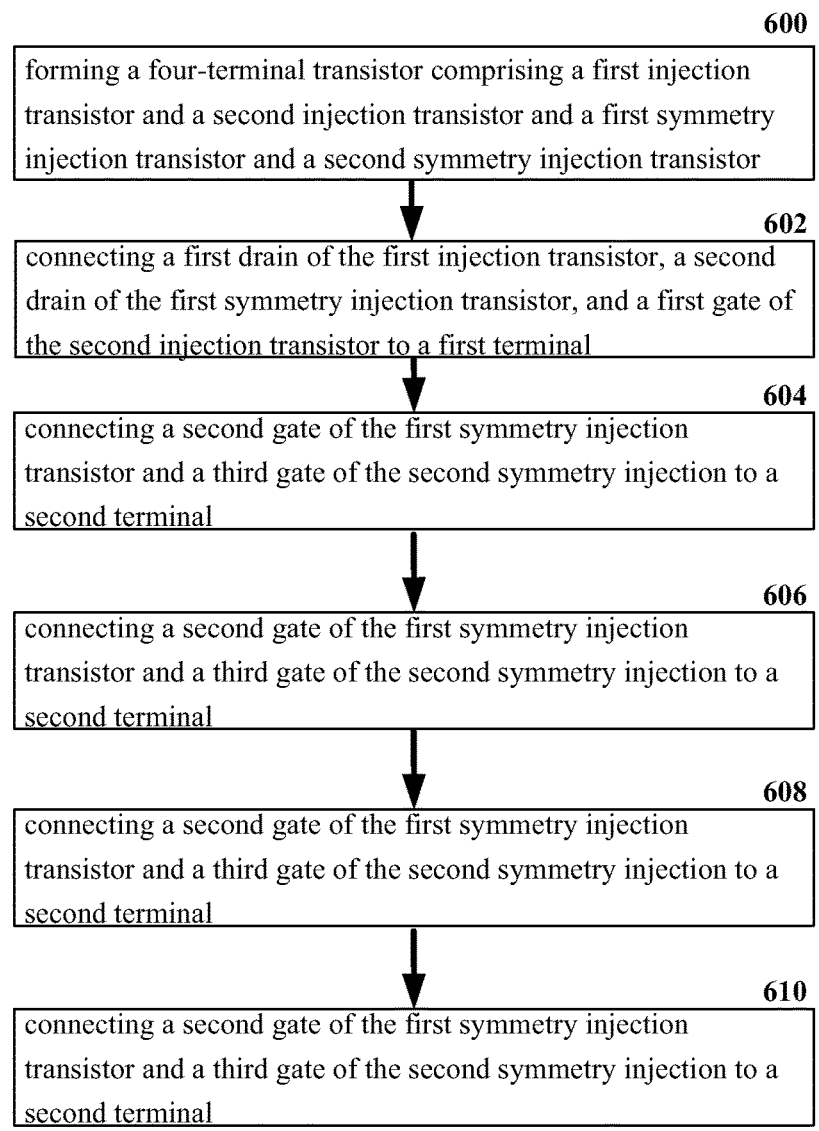
FIG. 6 illustrates an example method for forming four transistors onto a transistor cell.

Referring now to FIG. 6, illustrated is an example method for forming four transistors onto a transistor cell. At element 600 a four-terminal transistor comprising a first injection transistor and a second injection transistor and a first symmetry injection transistor and a second symmetry injection transistor can be formed. At element 602 a first drain of the first injection transistor, a second drain of the first symmetry injection transistor, and a first gate of the second injection transistor can be connected to a first terminal. The transistors can share drain terminals parasitic junction capacitances. A second gate of the first symmetry injection transistor and a third gate of the second symmetry injection can be connected to a second terminal at element 604. Further, at element 606 a third drain of the second injection transistor, a fourth drain of the second symmetry injection transistor, and a fourth gate of the second injection transistor can be connected to a third terminal. At element 608 the first drain of the first injection transistor can be cross-connected with the first gate of the second injection transistor; and the third drain of the second injection transistor can be cross-connected with the fourth gate of the first injection transistor at element 610.

Figure 7:
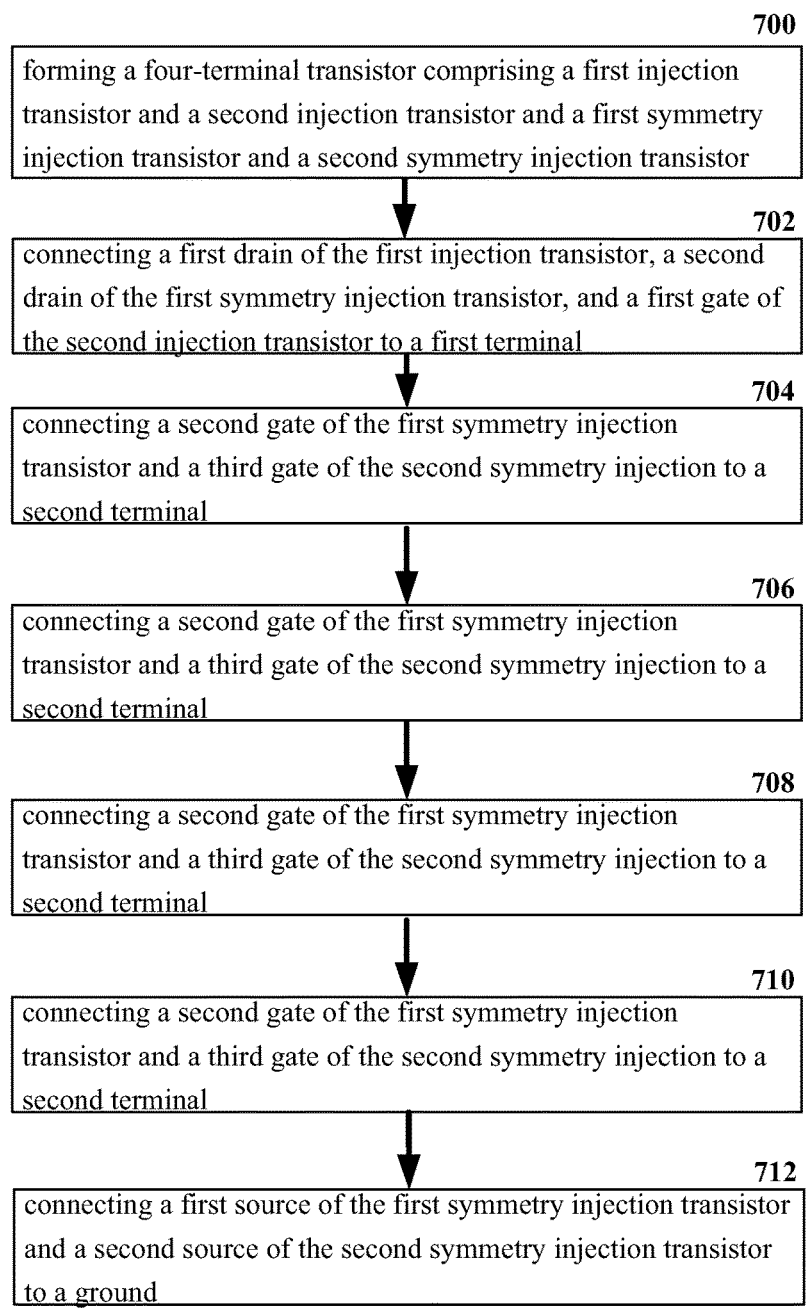
FIG. 7 illustrates an example schematic of a system block diagram of a method for forming four transistors onto a transistor cell comprising connecting symmetry injection transistor sources to a ground.

Referring now to FIG. 7, illustrated is an example schematic of a system block diagram of a method for forming four transistors onto a transistor cell comprising connecting symmetry injection transistor sources to a ground. At element 700 a four-terminal transistor comprising a first injection transistor and a second injection transistor and a first symmetry injection transistor and a second symmetry injection transistor can be formed. At element 702 a first drain of the first injection transistor, a second drain of the first symmetry injection transistor, and a first gate of the second injection transistor can be connected to a first terminal. The transistors can share drain terminals parasitic junction capacitances. A second gate of the first symmetry injection transistor and a third gate of the second symmetry injection can be connected to a second terminal at element 704. Further, at element 706 a third drain of the second injection transistor, a fourth drain of the second symmetry injection transistor, and a fourth gate of the second injection transistor can be connected to a third terminal. At element 908 the first drain of the first injection transistor can be cross-connected with the first gate of the second injection transistor; and the third drain of the second injection transistor can be cross-connected with the fourth gate of the first injection transistor at element 710. At element 712, a first source of the first symmetry injection transistor and a second source of the second symmetry injection transistor can be connect to a ground.

Figure 8:
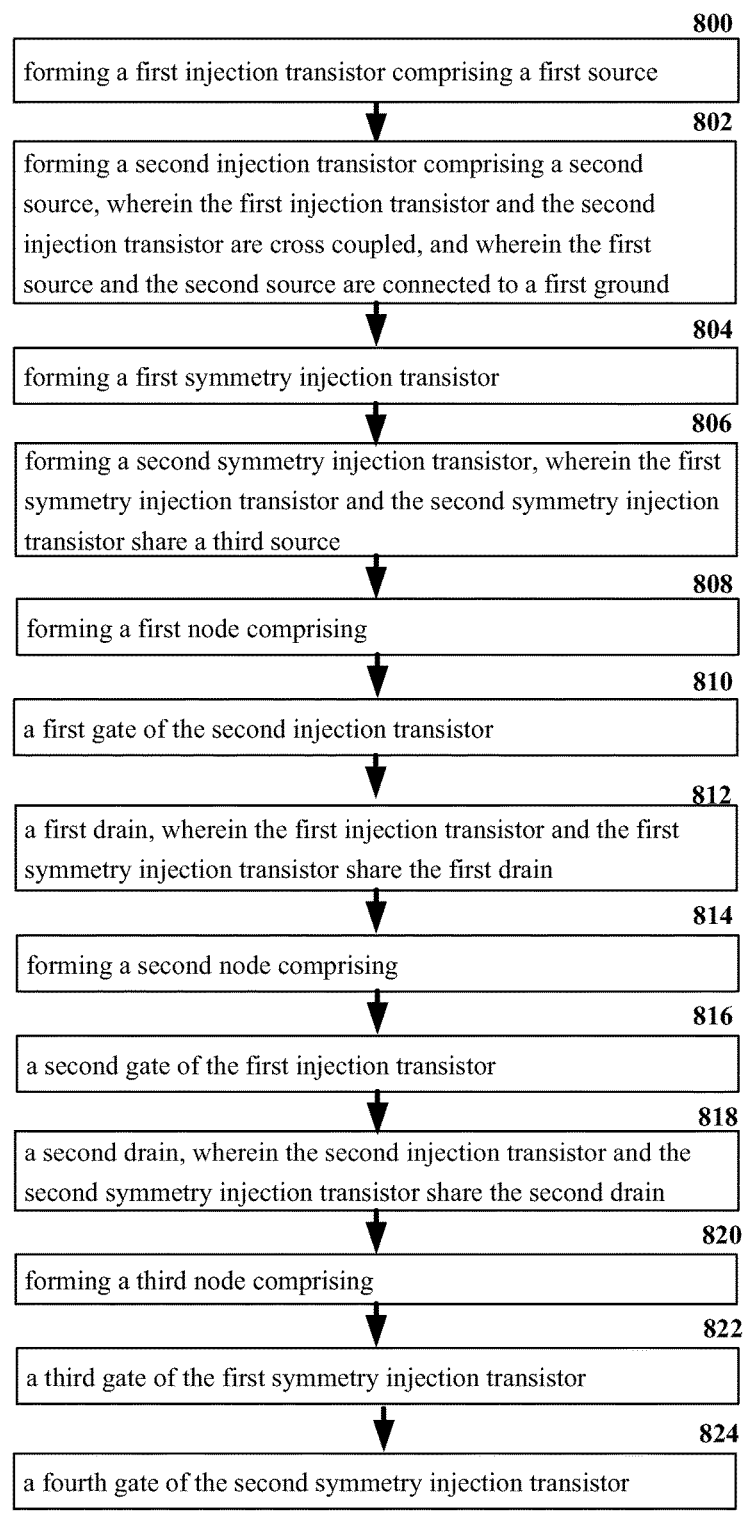
FIG. 8 illustrates an example schematic of a system block diagram of a symmetry injection-locked frequency divider comprising three sources, two drains, and four gates.

Referring now to FIG. 8, illustrated is an example schematic of a system block diagram of a symmetry injection-locked frequency divider comprising three sources, two drains, and four gates. At element 800, a first injection transistor comprising a first source can be formed. At element 802, a second injection transistor comprising a second source can be formed, wherein the first injection transistor and the second injection transistor can be cross coupled, and wherein the first source and the second source can be connected to a first ground. The cross-connection of the first injection transistor and the second injection transistor can be the only cross-connection, which can limit parasitic capacitance. At element 804, a first symmetry injection transistor can be formed, and a second symmetry injection transistor can be formed at element 806, wherein the first symmetry injection transistor and the second symmetry injection transistor share a third source. At element 808, a first node can be formed that can comprise a first gate of the second injection transistor at element 810 and can comprise a first drain, wherein the first injection transistor and the first symmetry injection transistor can share the first drain at element 812. At element 814, a second node can be formed that can comprise a second gate of the first injection transistor at element 816 and a second drain, wherein the second injection transistor and the second symmetry injection transistor share the second drain at element 818. At element 820, a third node can be formed that can comprise a third gate of the first symmetry injection transistor at element 822 and a fourth gate of the second symmetry injection transistor at element 824.

Figure 9:
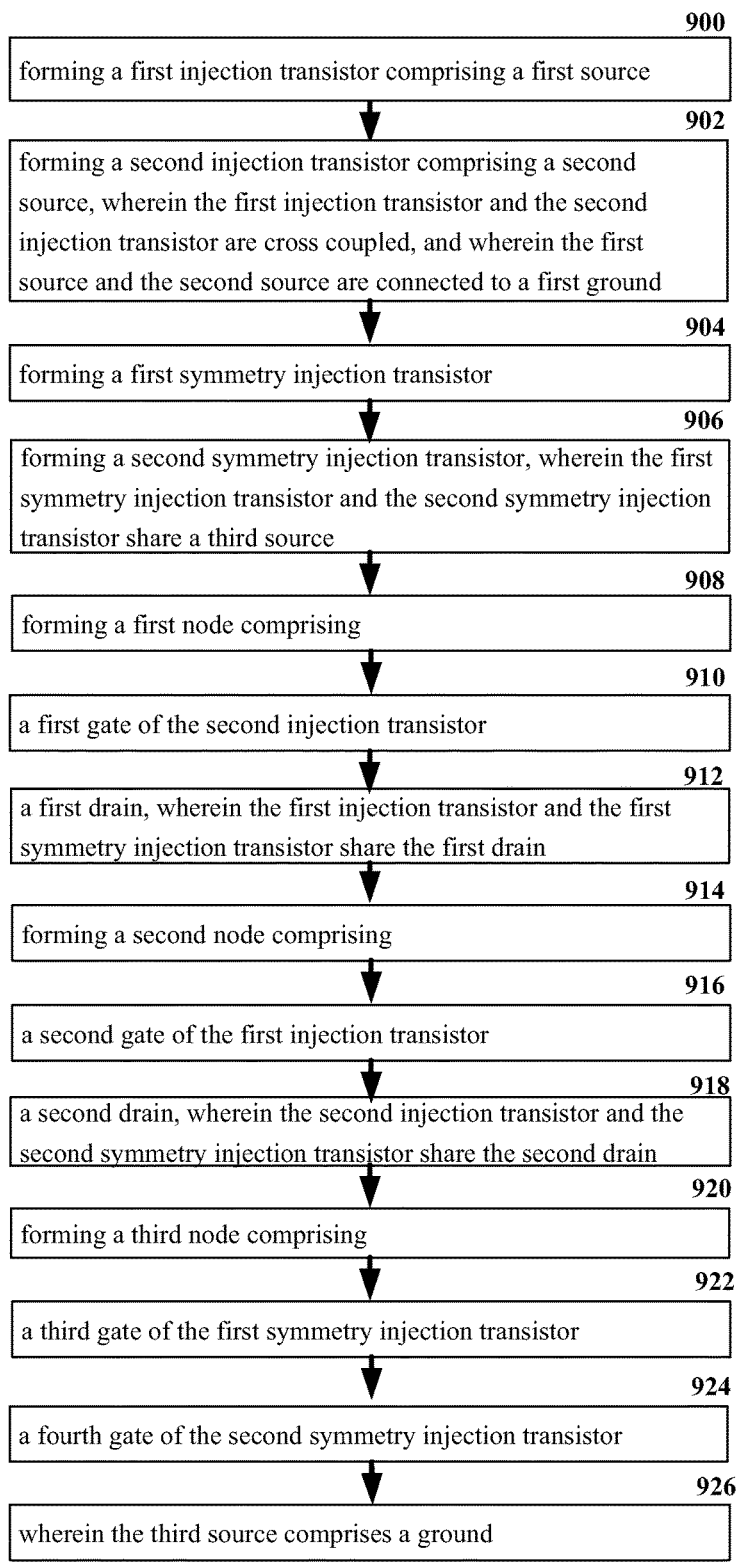
FIG. 9 illustrates an example schematic of a system block diagram of a symmetry injection-locked frequency divider comprising three sources, two drains, and four gates, wherein the third source comprises a ground.

Referring now to FIG. 9, illustrated is an example schematic of a system block diagram of a symmetry injection-locked frequency divider comprising three sources, two drains, and four gates wherein the third source comprises a ground. At element 900, a first injection transistor comprising a first source can be formed. At element 902, a second injection transistor comprising a second source can be formed, wherein the first injection transistor and the second injection transistor can be cross coupled, and wherein the first source and the second source can be connected to a first ground. The cross-connection of the first injection transistor and the second injection transistor can be the only cross-connection, which can limit parasitic capacitance. At element 904, a first symmetry injection transistor can be formed, and a second symmetry injection transistor can be formed at element 906, wherein the first symmetry injection transistor and the second symmetry injection transistor share a third source.

At element 908, a first node can be formed that can comprise a first gate of the second injection transistor at element 910 and can comprise a first drain, wherein the first injection transistor and the first symmetry injection transistor can share the first drain at element 912. At element 914, a second node can be formed that can comprise a second gate of the first injection transistor at element 916 and a second drain, wherein the second injection transistor and the second symmetry injection transistor share the second drain at element 918. At element 920, a third node can be formed that can comprise a third gate of the first symmetry injection transistor at element 922 and a fourth gate of the second symmetry injection transistor at element 924. Further, the third source can comprise a ground at element 926.

Figure 10:
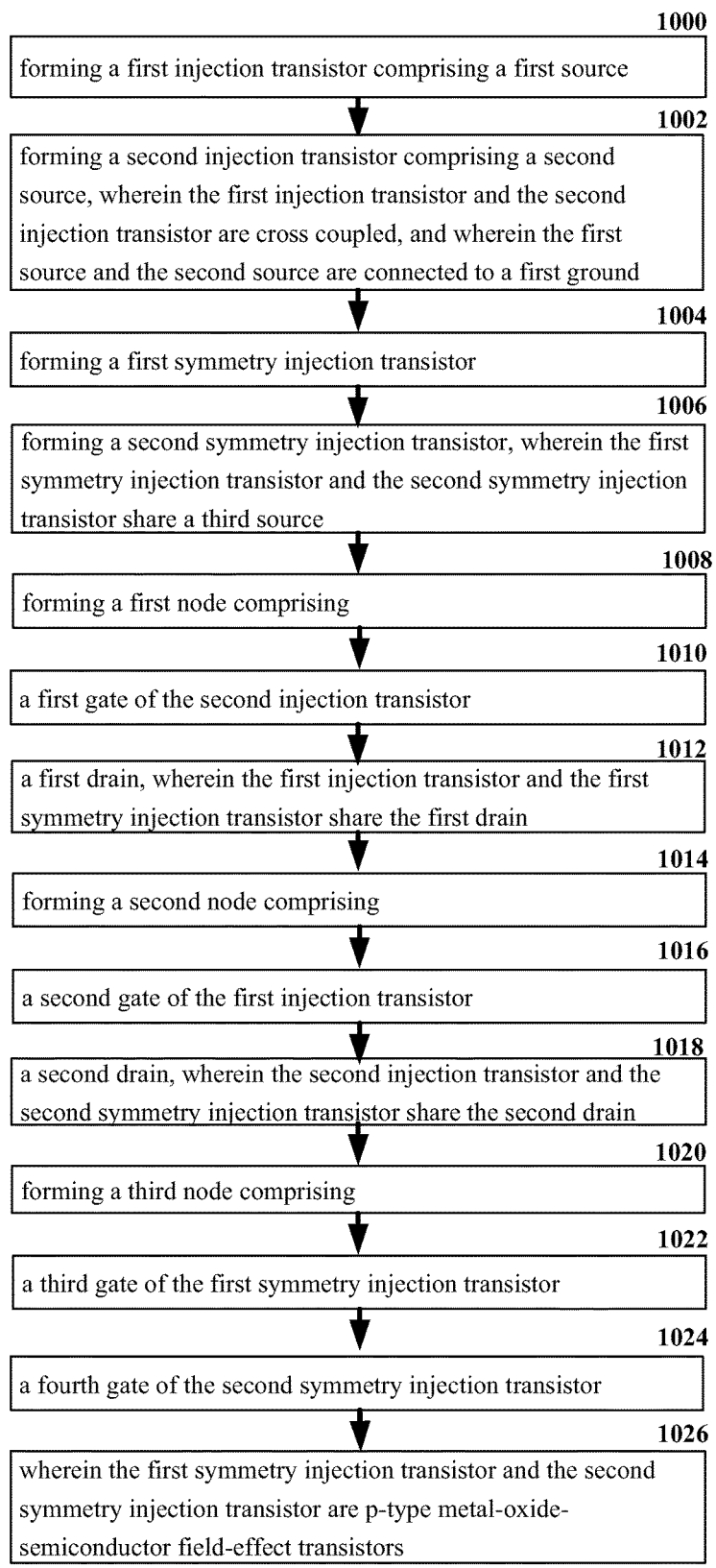
FIG. 10 illustrates an example schematic of a system block diagram of a symmetry injection-locked frequency divider comprising three sources, two drains, and four gates, wherein the first symmetry injection transistor and the second symmetry injection transistor are PMOS transistors.

Referring now to FIG. 10, illustrated is an example schematic of a system block diagram of a symmetry injection-locked frequency divider comprising three sources, two drains, and four gates wherein the first symmetry injection transistor and the second symmetry injection transistor can be p-type metal-oxide-semiconductor field-effect (PMOS) transistors. At element 1000, a first injection transistor comprising a first source can be formed. At element 1002, a second injection transistor comprising a second source can be formed, wherein the first injection transistor and the second injection transistor can be cross coupled, and wherein the first source and the second source can be connected to a first ground. The cross-connection of the first injection transistor and the second injection transistor can be the only cross-connection, which can limit parasitic capacitance.

At element 1004, a first symmetry injection transistor can be formed, and a second symmetry injection transistor can be formed at element 1006, wherein the first symmetry injection transistor and the second symmetry injection transistor share a third source. At element 1008, a first node can be formed that can comprise a first gate of the second injection transistor at element 1010 and can comprise a first drain, wherein the first injection transistor and the first symmetry injection transistor can share the first drain at element 1012. At element 1014, a second node can be formed that can comprise a second gate of the first injection transistor at element 1016 and a second drain, wherein the second injection transistor and the second symmetry injection transistor share the second drain at element 1018. At element 1020, a third node can be formed that can comprise a third gate of the first symmetry injection transistor at element 1022 and a fourth gate of the second symmetry injection transistor at element 1024. Furthermore, the first symmetry injection transistor and the second symmetry injection transistor can be PMOS transistors at element 1026.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An apparatus, comprising:
   a first injection transistor comprising a first source;
   a second injection transistor comprising a second source, wherein the first injection transistor and the second injection transistor are cross coupled, and wherein the first source and the second source are connected to a first ground;
   a first symmetry injection transistor comprising a third source;
   a second symmetry injection transistor comprising a fourth source, wherein the third source and the fourth source are connected to a second ground, wherein the first symmetry injection transistor, the second symmetry injection transistor, the first injection transistor, and the second injection transistor are formed on a single transistor cell, and wherein a transistor width of a transistor of at least one of the first symmetry injection transistor, the second symmetry injection transistor, the first injection transistor, or the second injection transistor varies from that of another transistor width of a different transistor of the at least one of the first symmetry injection transistor, the second symmetry injection transistor, the first injection transistor, or the second injection transistor;
   a first node comprising:
     a first drain of the first injection transistor;
     a first gate of the second injection transistor; and
     a second drain of the first symmetry injection transistor;
   a second node comprising:
     a third drain of the second injection transistor;
     a second gate of the first injection transistor; and
     a fourth drain of the second symmetry injection transistor; and
   a third node comprising:
     a third gate of the first symmetry injection transistor; and
     a fourth gate of the second symmetry injection transistor.

2. The apparatus of claim 1, wherein the first symmetry injection transistor and the second symmetry injection transistor are p-type metal-oxide-semiconductor field-effect transistors.

3. The apparatus of claim 1, wherein the first injection transistor and the second injection transistor are p-type metal-oxide-semiconductor field-effect transistors.

4. The apparatus of claim 1, further comprising:
   an inductor, wherein there is an electrical contact made at a midpoint of the inductor.

5. The apparatus of claim 4, wherein the inductor is a standard inductor.

6. The apparatus of claim 4, wherein the inductor is a symmetric inductor.

7. The apparatus of claim 1, wherein the first injection transistor and the second injection transistor are n-type metal-oxide-semiconductor field-effect transistors.

8. A method, comprising:
   forming a first symmetry injection transistor, a second symmetry injection transistor, a first injection transistor, and a second injection transistor on a single transistor cell, wherein a transistor width of a transistor of at least one of the first symmetry injection transistor, the second symmetry injection transistor, the first injection transistor, or the second injection transistor varies from that of another transistor width of a different transistor of the at least one of the first symmetry injection transistor, the second symmetry injection transistor, the first injection transistor, or the second injection transistor, wherein the forming comprises;
   cross-coupling the first injection transistor comprising a first source, and the second injection transistor comprising a second source,
   connecting the first source and the second source to a first ground,
   connecting a third source of first symmetry injection transistor to a fourth source of the second symmetry injection transistor, and
   connecting the third source and the fourth source to a second ground;
   forming a first node comprising:
     a first drain of the first injection transistor,
     a first gate of the second injection transistor, and
     a second drain of the first symmetry injection transistor;
   forming a second node comprising:
     a third drain of the second injection transistor,
     a second gate of the first injection transistor, and
     a fourth drain of the second symmetry injection transistor; and
   forming a third node comprising:
     a third gate of the first symmetry injection transistor, and
     a fourth gate of the second symmetry injection transistor.

9. The method of claim 8, wherein the forming the first symmetry injection transistor comprises forming a p-type metal-oxide-semiconductor field-effect transistor.

10. The method of claim 9, wherein the forming the second injection transistor comprises forming p-type metal-oxide-semiconductor field-effect transistor.

11. The method of claim 8, wherein the forming the first injection transistor and the second injection transistor comprises forming n-type metal-oxide-semiconductor field-effect transistors.

12. The method of claim 8, wherein the forming comprises integrating the first injection transistor, the second injection transistor, the first symmetry injection transistor, and the second symmetry injection transistor into a standard radio frequency transistor cell.

13. The method of claim 8, further comprising:
   connecting a first terminal and a second terminal to an inductor.

14. The method of claim 13, wherein the connecting the first terminal and the second terminal to the inductor comprises connecting an electrical contact at or about at a midpoint of the inductor.

15. A device, comprising:
   a first injection transistor comprising a first source;
   a second injection transistor comprising a second source, wherein the first injection transistor and the second injection transistor are cross coupled, and wherein the first source and the second source are connected to a first ground;
   a first symmetry injection transistor comprising a third source;
   a second symmetry injection transistor comprising a fourth source, wherein the first symmetry injection transistor, the second symmetry injection transistor, the first injection transistor, and the second injection transistor are included in a single transistor cell, wherein a transistor width of a transistor of a group comprising at least one of the first symmetry injection transistor, the second symmetry injection transistor, the first injection transistor, or the second injection transistor varies from that of another transistor width of a different transistor of the group, wherein the third source of the first symmetry injection transistor is connected to a fourth source of the second symmetry injection transistor;

connecting the third source and the fourth source to a second ground;

a first node comprising:
 a first gate of the second injection transistor; and
 a first drain, wherein the first injection transistor and the first symmetry injection transistor share the first drain;

a second node comprising:
 a second gate of the first injection transistor; and
 a second drain, wherein the second injection transistor and the second symmetry injection transistor share the second drain; and a third node comprising:
 a third gate of the first symmetry injection transistor; and
 a fourth gate of the second symmetry injection transistor.

16. The device of claim 15, wherein the third source comprises a ground.

17. The device of claim 15, wherein the first symmetry injection transistor and the second symmetry injection transistor are p-type metal-oxide-semiconductor field-effect transistors.

18. The device of claim 15, wherein the first injection transistor and the second injection transistor are p-type metal-oxide-semiconductor field-effect transistors.

19. The device of claim 15, wherein a first terminal and a second terminal, of a four terminal transistor, is connected to an inductor.

20. The device of claim 19, wherein the inductor is a symmetric inductor.

* * * * *